(12) United States Patent
Choi et al.

(10) Patent No.: US 11,214,699 B2
(45) Date of Patent: Jan. 4, 2022

(54) INK COMPOSITION

(71) Applicant: LG CHEM, LTD., Seoul (KR)

(72) Inventors: Kook Hyun Choi, Daejeon (KR); Joon Hyung Kim, Daejeon (KR); Yu Jin Woo, Daejeon (KR); Mi Lim Yu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/757,174

(22) PCT Filed: Oct. 19, 2018

(86) PCT No.: PCT/KR2018/012395
§ 371 (c)(1),
(2) Date: Apr. 17, 2020

(87) PCT Pub. No.: WO2019/078666
PCT Pub. Date: Apr. 25, 2019

(65) Prior Publication Data
US 2021/0198502 A1    Jul. 1, 2021

(30) Foreign Application Priority Data

Oct. 20, 2017 (KR) .......................... 10-2017-0136447

(51) Int. Cl.
| | |
|---|---|
| *C08F 2/46* | (2006.01) |
| *C08F 2/50* | (2006.01) |
| *C08G 61/04* | (2006.01) |
| *C09D 11/101* | (2014.01) |
| *C09D 11/38* | (2014.01) |
| *H01L 51/00* | (2006.01) |
| *H01L 51/52* | (2006.01) |
| *H01L 51/56* | (2006.01) |

(52) U.S. Cl.
CPC ............ *C09D 11/101* (2013.01); *C09D 11/38* (2013.01); *H01L 51/0035* (2013.01); *H01L 51/5253* (2013.01); *H01L 51/5275* (2013.01); *H01L 51/56* (2013.01)

(58) Field of Classification Search
CPC ............... C08F 2/50; C08F 2/46; C08G 61/04
USPC ................. 522/66, 6, 189, 184, 71, 1; 520/1
See application file for complete search history.

(56) References Cited

U.S. PATENT DOCUMENTS

| | | | |
|---|---|---|---|
| 6,780,900 B1 | 8/2004 | Malhotra | |
| 2010/0079568 A1 | 4/2010 | Miura et al. | |
| 2012/0064336 A1* | 3/2012 | Tanaka | ................... C09J 135/06 |
| | | | 428/345 |
| 2016/0053176 A1* | 2/2016 | Kobayashi | ............. C09K 19/04 |
| | | | 428/1.2 |
| 2017/0227844 A1 | 8/2017 | Park et al. | |

FOREIGN PATENT DOCUMENTS

| | | |
|---|---|---|
| CN | 103221874 A | 7/2013 |
| EP | 1528087 A2 | 5/2005 |
| JP | 64-54442 A | 3/1989 |
| JP | 6454442 A | 3/1989 |
| JP | 2005120141 A | 5/2005 |
| JP | 2006282875 A | 10/2008 |
| JP | 2009-298956 A | 12/2009 |
| JP | 2010-111713 A | 5/2010 |
| JP | 2011006660 A | 1/2011 |
| JP | 2016-178056 A | 10/2016 |
| KR | 10-2001-0102954 A | 11/2001 |
| KR | 10-2009-0082264 A | 7/2009 |
| KR | 10-2012-0018171 A | 2/2012 |
| TW | 201105761 A1 | 2/2011 |
| TW | 201247603 A1 | 12/2012 |
| WO | 03/011990 A2 | 2/2003 |
| WO | 2008053985 A1 | 5/2008 |

* cited by examiner

*Primary Examiner* — Jessica Whiteley
(74) *Attorney, Agent, or Firm* — Dentons US LLP

(57) ABSTRACT

The present application relates to an ink composition comprising a glycidyl ether compound and a method for forming an organic layer using the same, and provides an ink composition capable of forming an organic layer and adjusting haze in a curing process for an intended use, and a method of forming an organic layer using the same.

18 Claims, No Drawings

INK COMPOSITION

CROSS-REFERENCE TO RELATED APPLICATIONS

The present application is a U.S. National Stage application of PCT/KR2018/012395, filed Oct. 19, 2018, which claims the benefit of priority based on Korean Patent Application No. 10-2017-0136447 filed on Oct. 20, 2017, the disclosures of which are incorporated herein by reference in their entireties.

TECHNICAL FIELD

The present application relates to an ink composition and a method for forming an organic layer using the same.

BACKGROUND ART

In the ink-jet printing related industry, which has recently grown remarkably, improvement in ink-jet printer performance or improvement in ink, and the like has been progressing dramatically.

The improved ink composition can be applied to various technical fields. For example, it is applicable for encapsulating an organic electronic device through an organic layer printed with the ink composition, or to a light extraction layer applied to an organic electronic device.

However, in preparing different compositions for each application, there is a problem that the process efficiency deteriorates.

DISCLOSURE

Technical Problem

The present application relates to an ink composition, and provides an ink composition capable of forming an organic layer and adjusting haze in a curing process for an intended use, and a method for forming an organic layer using the same.

Technical Solution

The present application relates to an ink composition. The ink composition may be, for example, an encapsulating material applied to seal or encapsulate an organic electronic device such as an OLED. In one example, the ink composition of the present application can be applied to sealing or encapsulating the entire surface of an organic electronic element. Thus, after the ink composition is applied to the encapsulation, it may be present in the form of an organic layer sealing the entire surface of the organic electronic device.

The ink composition of the present application is not limited to the above use, which can be applied to the formation of a light extraction layer applied to organic electronic devices. In the organic electronic element, light loss occurs between the interfaces of the substrate due to the difference in the refractive index of the element, and only light in a specific angle domain can be emitted to the outside. The amount emitted to the outside is about 20% or so, and the light extraction efficiency is extremely limited. The efficiency and utilization of the organic electronic element can be lowered without improving the light extraction efficiency. Accordingly, a light extraction layer for increasing the light extraction efficiency is required, where the ink composition can be applied as the light extraction layer.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

However, the present application is not limited to the above use, which can be widely applied as a light extraction layer or a sealing material of a display device.

In an embodiment of the present application, an exemplary ink composition may comprise a glycidyl ether compound in an amount of 7 to 38 wt % of the total composition. The glycidyl ether may be included, for example, in an amount of 10 to 35 wt %, 13 to 33 wt %, 18 to 28 wt %, or 19 to 26 wt % of the total composition. The ink composition may be a composition of which haze is adjusted by UV irradiation. The haze adjustment may mean that the haze of the composition changes due to UV irradiation of the composition, for example, it may mean that a user can adjust haze to the desired haze range. In one example, the ink composition may have a haze value at a time point f after being irradiated with UV rays at a UV light quantity of 7600 mJ/cm$^2$ or more, or 7700 mJ/cm$^2$ or more from a random time point i (a state where the composition has not been irradiated or partially irradiated with UV) larger than a haze value for the ink composition at the time point i. The upper limit of the UV light quantity is not particularly limited, but may be 15,000 mJ/cm$^2$, and thus, the haze may be increased by the difference in the haze value for the ink composition at a f time point after being irradiated with UV rays at any UV light quantity of 7600 to 15,000 mJ/cm$^2$ from the i time point. In another embodiment of the present application, the ink composition may have a haze value $H_{300}$ upon irradiation at a light quantity of 300 mJ/cm$^2$ smaller than a haze value $H_{8000}$ upon irradiation at a light quantity of 8000 mJ/cm$^2$. That is, in the present application, upon irradiating the ink composition with UV rays, the haze value of the ink composition cured product may be changed according to the light quantity of UV rays, and the haze value may have a higher value at a high light quantity than at a low light quantity. In this specification, the comparison of such two haze values may be made under the same conditions. Conventionally, an inorganic material such as an inorganic filler was added to control the haze, but in this case, the viscosity was unnecessarily increased, thereby lowering the ink-jet characteristics and deteriorating dispersibility, and when additives for dispersion were added, a problem of element damage due to impurities had occurred. However, by adjusting the haze value according to the UV light quantity as above, the present application can change the haze value of the cured product of the ink composition to a desired level depending on the intended use and the application position. Accordingly, by changing only the curing process for the same composition, instead of preparing a separate ink composition for each intended use, the composition can be applied to various fields to promote the efficiency of the process. In addition, the present application does not comprise any inorganic material or inorganic filler, whereby it can provide an ink composition having excellent ink-jet characteristics and dispersibility.

In this specification, the haze may be measured according to the standard of JIS K7105 for the cured ink composition.

In one example, the cured ink composition may have a haze value in a range of 0.1 to 50% or 0.1 to 30%. In an embodiment of the present application, the ratio ($H_{8000}/H_{300}$) of the $H_{8000}$ haze value to the $H_{300}$ haze value may be in a range of 15 to 100, 16 to 95, 17 to 93, 18 to 88, 19 to 83 or 20 to 79. In addition, the ratio ($H_f/H_i$) of the haze value ($H_f$) at the f time point to the haze value ($H_i$) at the i time point as described above may be in the above-described range. By adjusting the haze value according to the UV light quantity to the above range, the present application makes it possible to apply the ink composition to various fields by the haze adjustment.

In an embodiment of the present application, the ink composition may comprise a glycidyl ether compound, as described above. By comprising the compound, the present application makes it possible to adjust the haze value of the ink composition to a desired range according to the UV light quantity. Furthermore, the ink composition may further comprise an epoxy compound having cyclic structures in the molecular structure. The epoxy compound may have at least bifunctionality or more. That is, two or more epoxy functional groups may be present in the compound. The epoxy compound enables the haze of the ink composition to be adjusted and simultaneously realizes an appropriate degree of crosslinking to the ink composition, thereby realizing excellent heat resistance durability at high temperature and high humidity.

In an embodiment of the present application, the epoxy compound having cyclic structures in the molecular structure may have ring constituent atoms in the molecular structure in a range of 3 to 10, 4 to 8 or 5 to 7, and two or more and 10 or less of the cyclic structures may be present in the compound. The epoxy compound having cyclic structures in the molecular structure may be included in an amount of 40 to 150 parts by weight, 45 to 140 parts by weight, 48 to 138 parts by weight, 52 to 133 parts by weight, 55 to 128 parts by weight or 57 to 115 parts by weight, relative to 100 parts by weight of the glycidyl ether compound. By adjusting the content ratio between the respective compounds, the present application can realize excellent adhesive strength and curing sensitivity of the cured product together with the haze adjustment according to the light quantity.

In an embodiment of the present application, the ink composition may further comprise a compound having an oxetane group. The compound having an oxetane group may be included in the composition in an amount of 150 to 300 parts by weight, 160 to 290 parts by weight, 168 to 288 parts by weight, 172 to 283 parts by weight or 180 to 280 parts by weight, relative to 100 parts by weight of the glycidyl ether compound as described above. Also, in an embodiment of the present application, when the composition simultaneously comprises the compound having an oxetane group and the epoxy compound having cyclic structures, the epoxy compound having cyclic structures may be included in an amount of 15 to 50 parts by weight, 17 to 48 parts by weight, 22 to 43 parts by weight, 24 to 39 parts by weight or 25 to 38 parts by weight, relative to 100 parts by weight of the compound having an oxetane group. By controlling the specific composition and the content range thereof, the present application can form an organic layer on an organic electronic element by an ink-jet method together with the haze adjustment according to the light quantity, and the applied ink composition has excellent spreadability in a short time, which can provide an organic layer having excellent curing sensitivity after being cured.

In one example, the epoxy compound having cyclic structures in the molecular structure as described above may have an epoxy equivalent in a range of 50 to 350 g/eq, 73 to 332 g/eq, 94 to 318 g/eq, or 123 to 298 g/eq. In one example, the compound having an oxetane group, the epoxy compound having cyclic structures or the glycidyl ether compound may have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of each compound to be low, the present application can realize excellent printability when applied to ink-jet printing and simultaneously provide a moisture barrier property and excellent curing sensitivity. In this specification, the weight average molecular weight may mean a value converted to standard polystyrene measured by GPC (gel permeation chromatograph). In this specification, the epoxy equivalent is also grams (g/eq) of the resin containing one gram equivalent of an epoxy group, which may be measured according to the method defined in JIS K 7236.

In addition, the compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, the epoxy compound having cyclic structures in the molecular structure may be exemplified by an alicyclic epoxy compound. For example, the compound may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis (3,4-epoxycyclohexanecarboxylate) and derivatives, but is not limited thereto.

In one example, as long as the compound comprising an oxetane group has the oxetane functional group, the structure is not limited, and for example, OXT-221, CHOX, OX-SC, OXT101, OXT121, OXT221 or OXT212 from TOAGOSEI, or EHO, OXBP, OXTP or OXMA from ETERNACOLL may be exemplified.

Also, the glycidyl ether compound may include aliphatic glycidyl ether, benzyl glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, n-butyl glycidyl ether, 2-ethylhexyl glycidyl ether or neopentyl glycol diglycidyl ether, but is not limited thereto.

In an embodiment of the present application, the ink composition may further comprise a photoinitiator. The photoinitiator may be a cationic photopolymerization initiator. In addition, the photoinitiator may be a compound that absorbs a wavelength in a range of 200 nm to 400 nm.

As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be used. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the ink composition of the present application may comprise a photoinitiator containing an iodonium salt or a sulfonium salt as a photoinitiator in the specific composition as described above, so as to be suitable for use in sealing an organic electronic element by an inkjet method. Even though the ink composition according to the above composition is sealed directly on the organic electronic element, it is possible to prevent chemical damage from being applied to the element because of less outgassing. In addition, the photoinitiator has excellent solubility, which can be suitably applied to an inkjet process.

In an embodiment of the present application, the photoinitiator may be included in an amount of 1 to 15 parts by weight, 2 to 13 parts by weight or 3 to 11 parts by weight, relative to 100 parts by weight of a curable compound in the composition. The curable compound may mean the glycidyl ether compound, the epoxy compound having cyclic structures in the molecular structure and/or the compound having an oxetane group as described above, which are included in the composition.

In an embodiment of the present application, the ink composition may further comprise a surfactant. The ink composition can be provided as a liquid ink having improved spreadability by containing a surfactant. In one example, the surfactant may comprise a polar functional group. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-described epoxy compound and compound having an oxetane group to provide excellent coating properties on the organic electronic element. On the other hand, in the case of a surfactant containing a polar reactive group, since the affinity of the surfactant with other components of the ink composition is high, it is possible to participate in the curing reaction, thereby realizing an excellent effect in terms of adhesion. In an embodiment of the present application, a hydrophilic fluorine-based surfactant or non-silicone-based surfactant may be used to improve coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in the composition in an amount of 0.1 parts by weight to 10 parts by weight, 0.05 parts by weight to 10 parts by weight, 0.1 parts by weight to 10 parts by weight, 0.5 parts by weight to 8 parts by weight, or 1 part by weight to 4 parts by weight, relative to 100 parts by weight of the curable compound. Within the content range, the present application makes it possible that the ink composition is applied to an inkjet method to form an organic layer of a thin film.

In an embodiment of the present application, the ink composition may comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino) coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H,11H-Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 parts by weight to 40 parts by weight, 31 parts by weight to 38 parts by weight or 32 parts by weight to 36 parts by weight, relative to 100 parts by weight of the photoinitiator. By adjusting the content of the photosensitizer, the present application can prevent the photosensitizer from failing to dissolve and lowering the adhesion while realizing a synergistic action of curing sensitivity at a desired wavelength.

The ink composition of the present application may further comprise a coupling agent. The present application can improve adhesiveness of a cured product of the ink composition to an adherend or moisture transmission resistance of the cured product. The coupling agent may include, for example, a titanium-based coupling agent, an aluminum-based coupling agent, a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysi lane, 3-aminopropyltriethoxysilane, 3-aminopropyl dimethoxymethylsilane, N-phenyl-3-aminopropyltrimethoxysilane, N-methylaminopropyl trimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysi lane, methacryloxypropyl trimethoxysilane, imidazolesilane, triazinesilane, and the like.

In the present application, the coupling agent may be included in the composition in an amount of 0.1 to 10 parts by weight or 0.5 to 5 parts by weight, relative to 100 parts by weight of the curable compound. Within the above range, the present application can realize an effect of improving the adhesiveness by the addition of the coupling agent.

The ink composition of the present application may comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a moisture-reactive adsorbent, and may include zeolite, zirconia or montmorillonite, and the like, in the case of the physical adsorbent.

The ink composition of the present application may comprise the moisture adsorbent in the composition in an amount of 5 parts by weight to 100 parts by weight, 5 to 80 parts by weight, 5 parts by weight to 70 parts by weight or 10 to 30 parts by weight, relative to 100 parts by weight of the curable compound. As the ink composition of the present application preferably controls the content of the moisture adsorbent to 5 parts by weight or more, the present application can make the ink composition or the cured product thereof exhibit excellent moisture and humidity barrier properties. In addition, by controlling the content of the moisture adsorbent to 100 parts by weight or less, the present application can provide a thin film sealing structure.

However, as described above, the particles such as the moisture adsorbent or the inorganic filler may not be included in the composition, without being limited thereto, because they cause a dispersion problem, such as occurrence of aggregation, and a viscosity increase factor.

The ink composition of the present application may comprise a heat stabilizer, as described above. The heat stabilizer may be exemplified by a cresol compound, and specifically, is exemplified by 2,6-di-tert-butyl-p-cresol and the like. In another example, the heat stabilizer includes a thiazine compound, a quinone-based compound, an amino alcohol, and the like, and a specific example thereof may include phenothiazine (PTZ), methylenequinones, 2-dimethylamino methanol, or monomethyl ether hydroquinone. By comprising a heat stabilizer, the present application realizes high storage stability even in long-term distribution or storage while preventing viscosity increase, gelation or curing reaction due to unnecessary heat energy in the above-mentioned composition. The heat stabilizer may be included in an amount of 0.1 parts by weight to 300 parts by weight, 1 part by weight to 120 parts by weight or 1.5 parts by weight to 53 parts by weight, relative to 100 parts by weight of the photoinitiator.

In addition to the above-mentioned constitutions, the ink composition according to the present application may comprise various additives in the range without affecting the above-described effects of invention. For example, the ink composition may comprise a defoamer, a tackifier, an ultraviolet stabilizer or an antioxidant and the like in an appropriate range of content depending on the desired physical properties.

In one example, the ink composition may be in a liquid phase at room temperature, for example, 15° C. to 35° C. or about 25° C. In an embodiment of the present application, the ink composition may be a solventless type liquid phase.

The ink composition may be applied to an encapsulating layer of an organic electronic element or a light extraction layer of an organic electronic element. As the ink composition has a liquid phase form at room temperature, the present application can be applied to the above applications in an inkjet manner.

Furthermore, in an embodiment of the present application, the ink composition may have a viscosity in a range of 50 cPs or less, 1 to 46 cPs, 3 to 44 cPs, 4 to 38 cPs, 5 to 33 cPs or 14 to 24 cPs, as measured by Brookfield's DV-3 at a temperature of 25° C., a torque of 90% and a shear rate of 100 rpm. By controlling the viscosity of the composition within the above range, the present application can increase coating properties at the time of being applied to an organic electronic element to provide a sealing material of a thin film.

Also, in an embodiment of the present application, the ink composition may have a light transmittance of 90% or more, 92% or more, or 95% or more in the visible light region after curing. Within the above range, the present application provides an organic electronic device having high-resolution, low power consumption and long-life by applying the ink composition to a top emission type organic electronic device.

In one example, the ink composition of the present application may have a contact angle to glass of 30° or less, 25° or less, 20° or less, or 12° or less. The lower limit is not particularly limited, but may be 1° or 3° or more. By adjusting the contact angle to 30° or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

The present application also relates to a method for forming an organic layer. The method for forming the organic layer may comprise irradiating the above-mentioned ink composition with UV rays. The present application can cure the ink composition through the UV irradiation step. Furthermore, the present application can adjust the haze of the ink composition by irradiating it with the UV rays. That is, UV rays can be irradiated in the curing process of the ink composition, and the haze can be adjusted according to the UV light quantity. In one example, the method for forming an organic layer of the present application may comprise adjusting the haze according to the UV light quantity. In one example, as the UV light quantity increases, the haze may increase.

The method for forming an organic layer may comprise coating the above-described ink composition according to the intended use. For example, in the present application, the composition can be applied on a substrate on which an organic electronic element is formed. The application may use inkjetting, gravure coating, spin coating, screen printing or reverse offset coating. Also, the application may proceed before the UV irradiation step as described above.

In one example, the thickness of the organic layer may be in a range of 2 µm to 800 µm, 2.5 µm to 500 µm, 2.8 µm to 100 µm, 3 µm to 50 µm or 5 µm to 20 µm. The present application can provide a thin-film electronic device by providing a thin organic layer, and can achieve the desired optical properties.

In one example, the method for forming an organic layer of the present application may comprise irradiating the ink composition with UV rays having a light quantity in a range of 20 mJ/cm$^2$ to 15,000 mJ/cm$^2$, 150 mJ/cm$^2$ to 10,000 mJ/cm$^2$, or 300 mJ/cm$^2$ to 8000 mJ/cm$^2$. By adjusting the light quantity in the above range, the present application can adjust the haze to a desired level while sufficiently performing the curing.

Furthermore, in one example, the organic layer formation method may proceed under an inert gas atmosphere. For example, the organic layer can be formed by applying the above-described ink composition under an $N_2$ atmosphere. The inert gas atmosphere can be maintained from application of the composition to UV irradiation. In addition, the organic layer formation method may proceed in a relative humidity atmosphere of 20% or less, 15% or less, or 10% or less. The lower limit is not particularly limited, which may be 0% or 3%. The relative humidity can be maintained from composition application to UV irradiation. By adjusting the above conditions, the present application can form an organic layer having high endurance reliability.

Advantageous Effects

The present application relates to an ink composition, and provides an ink composition capable of forming an organic layer by adjusting haze in a curing process according to an intended use, and a method for forming an organic layer using the same.

BEST MODE

Hereinafter, the present invention will be described in more detail through Examples according to the present invention and Comparative Examples not complying with the present invention, but the scope of the present invention is not limited by the following examples.

Preparation of Ink Composition

A benzyl glycidyl ether compound and an n-butyl glycidyl ether compound were used as glycidyl ether compounds, an alicyclic epoxy compound (Celloxide 2021P from Daicel) was used as an epoxy compound having cyclic structures in the molecular structure, and OXT-221 from TOAGOSEI Co., Ltd. was used as an oxetane group-containing compound. A photoinitiator having a triphenylsulfonium salt (UV693 from TETRA CHEM) was used as a photoinitiator, 9,10-dibutoxyanthracene was used as a photosensitizer, and 2,6-di-tert-butyl-p-cresol (BHT from SIGMA aldrich) was used as a heat stabilizer.

Examples 1 to 3 and Comparative Examples 1 to 4

The respective components were put into a mixing container in the weight ratios shown in Table 1 below, and in the mixing container, a uniform ink composition was prepared using a planetary mixer (KK-250s from Kurabo).

TABLE 1

|  | Example | | | Comparative Example | | | |
| --- | --- | --- | --- | --- | --- | --- | --- |
|  | 1 | 2 | 3 | 1 | 2 | 3 | 4 |
| Benzyl glycidyl ether | 25 | — | — | — | — | 5 | 40 |
| n-Butyl glycidyl ether | — | 25 | 20 | — | — | — | — |
| Celloxide 2021P | 15 | 15 | 20 | 20 | 30 | 15 | 15 |
| OXT-221 | 55.95 | 55.95 | 55.95 | 75.95 | 65.95 | 79.95 | 40.95 |
| UV693 | 3 | 3 | 3 | 3 | 3 | 3 | 3 |
| 9,10-Dibutoxyanthracene | 1 | 1 | 1 | 1 | 1 | 1 | 1 |
| BHT | 0.05 | 0.05 | 0.05 | 0.05 | 0.05 | 0.05 | 0.05 |

1. Haze Measurement

The ink compositions prepared in Examples and Comparative Examples above were each spin-coated on a 50 mm×50 mm LCD glass to form an organic layer having a thickness of 8 µm. Thereafter, the light quantity was adjusted with time using Pheseon UV 395 nm LED.

It was irradiated with UV rays in a state where the curing atmosphere was maintained in an $N_2$ purged state and 10% relative humidity.

The light quantity was measured using ETT UV Power Puck II and it was irradiated with light quantities from 300 mJ/cm$^2$ to 8000 mJ/cm$^2$ according to the irradiation time after being fixed at a light intensity of 1000 mW/cm$^2$.

For the organic layer cured through the above process, the haze was measured according to JIS K7105 standard by using HM-150 and using air as a reference, and the results were shown in Table 2 below. The unit of haze is %, which was omitted in Table 2.

TABLE 2

| Light quantity (mJ/cm$^2$) | Example | | | Comparative Example | | | |
| --- | --- | --- | --- | --- | --- | --- | --- |
| | 1 | 2 | 3 | 1 | 2 | 3 | 4 |
| 300 | 0.17 | 0.15 | 0.12 | 0.12 | 0.18 | 0.17 | Not measurable |
| 500 | 0.34 | 0.22 | 0.11 | 0.12 | 0.15 | 0.16 | |
| 1000 | 0.5 | 0.7 | 0.85 | 0.14 | 0.13 | 0.18 | |
| 2000 | 1.05 | 1.02 | 0.15 | 0.13 | 0.15 | 0.12 | |
| 4000 | 5.29 | 1.31 | 0.88 | 0.15 | 0.16 | 0.19 | |
| 8000 | 13.28 | 3.05 | 3.15 | 0.12 | 0.17 | 0.16 | |

In Comparative Example 4, measurement of haze was impossible due to insufficient curing.

The invention claimed is:

1. An ink composition comprising a glycidyl ether compound in an amount of 7 to 38 wt % of the total composition,
   wherein haze of the ink composition is adjusted by UV irradiation, and
   wherein the haze of the ink composition is increased by increasing UV light quantity.

2. The ink composition according to claim 1, wherein a haze value for the ink composition at a time point f after being irradiated with UV rays at a UV light quantity of 7600 mJ/cm$^2$ or more from a random time point i is larger than a haze value for the ink composition at the time point i.

3. The ink composition according to claim 1, wherein a haze value $H_{300}$ upon irradiation at a light quantity of 300 mJ/cm$^2$ is smaller than a haze value $H_{8000}$ upon irradiation at a light quantity of 8000 mJ/cm$^2$.

4. The ink composition according to claim 1, further comprising an epoxy compound having cyclic structures.

5. The ink composition according to claim 4, wherein the epoxy compound having cyclic structures is at least bifunctional.

6. The ink composition according to claim 4, wherein the epoxy compound having cyclic structures has three to ten constituent atoms of a ring.

7. The ink composition according to claim 4, wherein the epoxy compound having cyclic structures is included in an amount of 40 to 150 parts by weight relative to 100 parts by weight of the glycidyl ether compound.

8. The ink composition according to claim 1, further comprising a compound having an oxetane group.

9. The ink composition according to claim 8, wherein the compound having an oxetane group has a weight average molecular weight in a range of 150 to 1,000 g/mol.

10. The ink composition according to claim 8, wherein the compound having an oxetane group is included in an amount of 150 to 300 parts by weight relative to 100 parts by weight of the glycidyl ether compound.

11. The ink composition according to claim 1, further comprising a photoinitiator.

12. The ink composition according to claim 1, wherein the composition is solventless.

13. The ink composition according to claim 1, wherein the haze value measured according to JIS K7105 standard in cured state is in a range of 0.1 to 50%.

14. The ink composition according to claim 1, wherein the composition is applied to an encapsulating layer of an organic electronic element or a light extraction layer of an organic electronic element.

15. The ink composition according to claim 3, wherein the ratio ($H_{8000}/H_{300}$) of the $H_{8000}$ haze value to the $H_{300}$ haze value is in a range of 15 to 100.

16. A method for forming an organic layer comprising irradiating the ink composition of claim 1 with UV rays.

17. The method for forming an organic layer according to claim 16, wherein the UV rays have a light quantity in a range of 20 mJ/cm$^2$ to 15,000 mJ/cm$^2$.

18. The ink composition according to claim 1, wherein the glycidyl ether compound includes aliphatic glycidyl ether, benzyl glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, n-butyl glycidyl ether, 2-ethylhexyl glycidyl ether, or neopentyl glycol diglycidyl ether.

* * * * *